(12) United States Patent
Wang et al.

(10) Patent No.: US 10,459,474 B1
(45) Date of Patent: Oct. 29, 2019

(54) CURRENT SENSOR

(71) Applicant: VIA LABS, INC., New Taipei (TW)

(72) Inventors: Wei-Yu Wang, New Taipei (TW); Cheng-Ming Ying, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 16/172,844

(22) Filed: Oct. 28, 2018

(30) Foreign Application Priority Data

Sep. 5, 2018 (TW) .............................. 107131203 A (51) Int. Cl.
| | | |
|---|---|---|
| *G01R 19/00* | (2006.01) | |
| *G05F 3/26* | (2006.01) | |
| *G01R 19/165* | (2006.01) | |
| *G05F 1/10* | (2006.01) | |
| *G05F 3/24* | (2006.01) | |

(52) U.S. Cl.
CPC ............ *G05F 3/26* (2013.01); *G01R 19/0092* (2013.01); *G01R 19/16519* (2013.01); *G05F 1/10* (2013.01); *G05F 3/24* (2013.01)

(58) Field of Classification Search
CPC ..... G05F 3/26; G05F 3/24; G05F 1/10; G01R 19/16519; G01R 19/0092
See application file for complete search history.

(56) References Cited

U.S. PATENT DOCUMENTS

| | | | | |
|---|---|---|---|---|
| 5,111,071 A | * | 5/1992 | Kwan | .............. G01R 19/16576 327/77 |
| 2014/0097828 A1 | | 4/2014 | Bertin et al. | |
| 2016/0320433 A1 | * | 11/2016 | Cheng | ................. G01R 19/0092 |
| 2018/0301174 A1 | * | 10/2018 | Arno | ................... G01R 19/0092 |

FOREIGN PATENT DOCUMENTS

| | | |
|---|---|---|
| CN | 103185826 | 7/2013 |
| CN | 104011551 | 8/2014 |
| TW | 201111805 | 4/2011 |

* cited by examiner

*Primary Examiner* — Jung Kim
(74) *Attorney, Agent, or Firm* — JCIPRNET (57) ABSTRACT

A current sensor includes a current sensing resistor, a first transistor, a second transistor, a bias voltage generating circuit, and a current mirror. The first terminal of the first transistor is coupled to the first terminal of the current sensing resistor. The first terminal of the second transistor is coupled to the second terminal of the current sensing resistor. The bias voltage generating circuit supplies a first bias voltage to the control terminal of the first transistor and a second bias voltage to the control terminal of the second transistor. The first bias voltage and the second bias voltage are dependent on the voltage of the first input terminal or the voltage of the second input terminal. The two current terminals of the current mirror are coupled to the second terminals of the second transistor and the first transistor, respectively.

12 Claims, 4 Drawing Sheets

CURRENT SENSOR

CROSS-REFERENCE TO RELATED APPLICATION

This application claims the priority benefit of Taiwan application serial no. 107131203, filed on Sep. 5, 2018. The entirety of the above-mentioned patent application is hereby incorporated by reference herein and made a part of this specification.

BACKGROUND

Technical Field

The disclosure relates to an electronic circuit, and more particularly to a current sensor.

Description of Related Art

According to design requirements, a certain target voltage (or target current) of an electronic circuit may need monitoring. For example, to prevent an overcurrent event from happening on a power path, a resistor and a voltage comparator can be placed in this power path. This resistor converts the current value obtained on this power path into a voltage value, and the voltage comparator can detect the voltage value of the resistor (the voltage difference across the resistor). For the input stage of a typical voltage comparator, the gate of the input stage transistor is used as the input to the voltage comparator. In high-voltage applications, the swing (variation range) of the input voltage of the voltage comparator is very large, that is, the gate voltage (the voltage difference between the gate and the source) of the input stage transistor (i.e., N-type metal oxide semiconductor (NMOS) transistor) can be large.

SUMMARY

Embodiments of the disclosure provide a current sensor for current sensing.

An embodiment of the disclosure provides a current sensor. The current sensor includes a current sensing resistor, a first transistor, a second transistor, a bias voltage generating circuit, and a current mirror. The first terminal and the second terminal of the current sensing resistor are respectively coupled to the first input terminal and the second input terminal of the current sensor. The first terminal of the first transistor is coupled to the first input terminal of the current sensor. The second terminal of the first transistor is coupled to the output terminal of the current sensor. The first terminal of the second transistor is coupled to the second input terminal of the current sensor. The bias voltage generating circuit is coupled to the control terminal of the first transistor to provide a first bias voltage. The bias voltage generating circuit is coupled to the control terminal of the second transistor to provide a second bias voltage. The first bias voltage and the second bias voltage are dependent on a voltage of the first input terminal of the current sensor or a voltage of the second input terminal of the current sensor. The first current terminal of the current mirror is coupled to the second terminal of the second transistor. The second current terminal of the current mirror is coupled to the second terminal of the first transistor.

In the embodiments of the disclosure, the voltage at the input of the current sensor is sent to the non-control terminal of the transistor. The two bias voltages generated by the bias generating circuit of the current sensor are dependent on one of the voltages of the two input terminals of the current sensor, so that the source gate voltage of the two input stage transistors of the current sensor is controlled to a small swing. The advantage is that the current sensor can be used to detect a large voltage range, for example, it can be applied in the field of Universal Serial Bus (USB) power delivery (PD) 3.0 to detect whether the current path of the power source flowing through the power source of 22 V or higher is overcurrent, but it is not limited thereto. When the current flows from the first input terminal of the current sensor to the second input terminal of the current sensor, the voltage of the first input terminal is greater than the voltage of the second input terminal, and at this time, the source gate voltage of the transistor connected to the first input terminal is greater than the source gate voltage of the transistor connected to the second input terminal, so that the current flowing through the transistor connected to the first input terminal is greater than the current flowing through the transistor connected to the second input terminal. At this time, the transistor connected to the first input terminal is turned on to pull up voltage of the output terminal of the current sensor.

When the current flows from the second input terminal of the current sensor to the first input terminal of the current sensor, the voltage of the first input terminal is less than the voltage of the second input terminal, and at this time, the source gate voltage of the transistor connected to the second input terminal is greater than the source gate voltage of the transistor connected to the first input terminal, such that the current flowing through the transistor connected to the second input terminal is greater than the current flowing through the transistor connected to the first input terminal. At this time, the transistor connected to the second input terminal is turned on, so that the current mirror pulls down the voltage at the output terminal of the current sensor. Therefore, the current sensor can perform current sensing.

The above described features and advantages of the disclosure will be more apparent from the following description.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The term "coupled (or connected)" as used throughout the specification (including the scope of the claims) may refer to any direct or indirect means of attachment. For example, if the first device is described as being coupled (or connected) to the second device, it should be construed that the first device can be directly connected to the second device, or the first device can be indirectly connected to the second device through other devices or some kind of connection means. In addition, wherever possible, the elements/components/steps that use the same reference numbers in the drawings and the embodiments represent the same or similar parts. Elements/components/steps that use the same reference numbers or use the same terms in different embodiments may refer to the related description.

Figure 1:
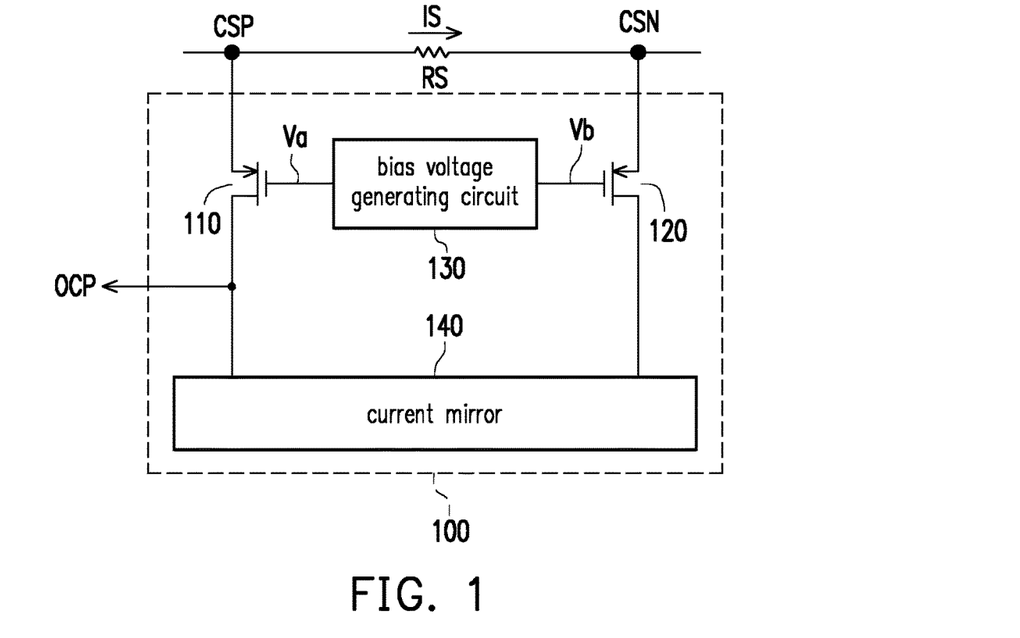
FIG. 1 is a schematic diagram of circuit blocks of a current sensor according to an embodiment of the disclosure.

FIG. 1 is a schematic diagram of circuit blocks of a current sensor according to an embodiment of the disclosure. The current sensor shown in FIG. 1 includes a voltage comparator 100 and a current sensing resistor RS. The voltage comparator 100 includes a transistor 110, a transistor 120, a bias voltage generating circuit 130, and a current mirror 140. A first terminal (e.g., a source) of the transistor 110 is coupled to a first input terminal CSP of the current sensor. A first terminal (e.g., a source) of the transistor 120 is coupled to a second input terminal CSN of the current sensor. A second terminal (e.g., a drain) of the transistor 120 is coupled to a first current terminal (e.g., a master current terminal) of the current mirror 140. The second terminal (e.g., the drain) of the transistor 110 is coupled to the output terminal OCP of the current sensor and the second current terminal (e.g., the servant current terminal) of the current mirror 140. A control terminal (e.g., a gate) of the transistor 110 is coupled to the bias voltage generating circuit 130 to receive the bias voltage Va. A control terminal (e.g., a gate) of the transistor 120 is coupled to the bias voltage generating circuit 130 to receive the bias voltage Vb. In the embodiment shown in FIG. 1, the transistor 110 and the transistor 120 are P-type metal oxide semiconductor (PMOS) transistors.

In the application scenario shown in FIG. 1, the first input terminal CSP and the second input terminal CSN of the current sensor are respectively coupled to different terminals of the current sensing resistor RS. The current sensing resistor RS and voltage comparator 100 can be considered a current sensor. When the current IS flows through the current sensing resistor RS, there would be a voltage difference between both terminals of the current sensing resistor RS (i.e., the first input terminal CSP and the second input terminal CSN). For example, when the current IS flows from the first input terminal CSP to the second input terminal CSN, the voltage of the first input terminal CSP is greater than the voltage of the second input terminal CSN. When the current IS flows from the second input terminal CSN to the first input terminal CSP, the voltage of the first input terminal CSP is less than the voltage of the second input terminal CSN. The voltage comparator 100 may compare the voltages of the first input terminal CSP with the second input terminal CSN and reflect the comparison result at the output terminal OCP of the current sensor.

The bias voltage generating circuit 130 is coupled to the control terminal of the transistor 110 to provide a bias voltage Va. The bias voltage generating circuit 130 is coupled to the control terminal of the transistor 120 to provide a bias voltage Vb. The bias voltage Va and the bias voltage Vb are dependent on the voltage of the first input terminal CSP or the voltage of the second input terminal CSN. For example, the bias voltage Va and the bias voltage Vb are dependent on one of the voltages of the first input terminal CSP and the voltage of the second input terminal CSN. Since the bias voltage Va and the bias voltage Vb are related to the voltage of the first input terminal CSP or the voltage of the second input terminal CSN, the source gate voltage (the voltage difference between the source and the gate) of the input stage transistor (the transistor 110 and the transistor 120) may be controlled to a small swing (small variation range).

The bias voltage Va and the bias voltage Vb may be determined according to design requirements. For example, in some embodiments, the bias voltage Va may be a difference between the voltage of the first input terminal CSP minus the threshold voltage of the transistor 110, and/or the bias voltage Vb may be a difference between the voltage at the second input terminal CSN minus the threshold voltage of the transistor 120. In some application scenarios, the bias voltage Va can be the same as the bias voltage Vb.

In the embodiment shown in FIG. 1, the voltage at the input of voltage comparator 100 is sent to the non-control terminal of the input stage transistor. For example, the voltage at the first input terminal CSP is sent to the first terminal (e.g., the source) of the transistor 110, and the voltage at the second input terminal CSN is sent to the first terminal (e.g., the source) of the transistor 120. Assuming that the bias voltage Va is the same as the bias voltage Vb, and assuming that the transistor 110 is the same size as the transistor 120, when the current IS flows from the first input terminal CSP to the second input terminal CSN, the voltage of the first input terminal CSP is greater than the voltage of the second input terminal CSN, and at this time, the source gate voltage of the transistor 110 is greater than the source gate voltage of the transistor 120, so that the current flowing through the transistor 110 is greater than the current flowing through the transistor 120. At this time, the transistor 110 turns on to pull up the voltage of the output terminal OCP of the current sensor. When the current IS flows from the second input terminal CSN to the first input terminal CSP, the voltage of the first input terminal CSP is less than the voltage of the second input terminal CSN, and at this time, the source gate voltage of the transistor 120 is greater than the source gate voltage of the transistor 110 such that the current flowing through the transistor 120 is greater than the current flowing through the transistor 110. At this time, the transistor 120 is turned on so that the current mirror 140 pulls down the voltage of the output terminal OCP of the current sensor. Therefore, the voltage comparator 100 can perform voltage comparison, that is, the current sensor shown in FIG. 1 performs current sensing. In an embodiment, the voltage comparator 100 can also be referred to as a current comparator, which may be used to perform current comparison between the first input terminal CSP and the second input terminal CSN.

Figure 2:
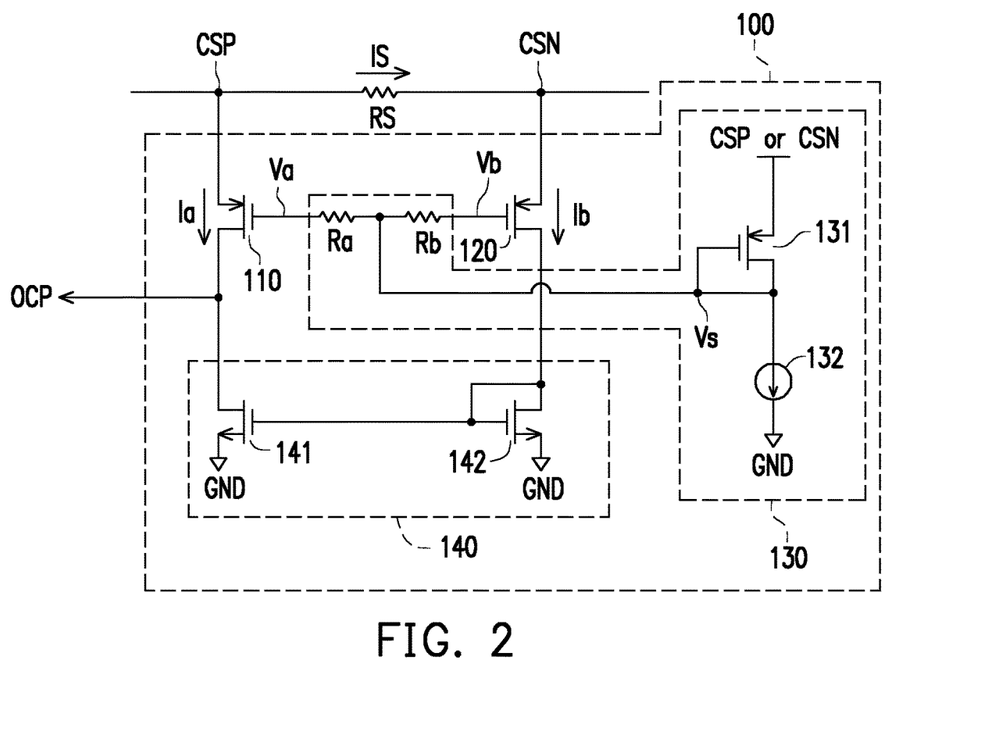
FIG. 2 is a circuit diagram of the bias voltage generating circuit and the current mirror of FIG. 1 according to an embodiment of the disclosure.

FIG. 2 is a schematic circuit diagram of the bias voltage generating circuit 130 and the current mirror 140 shown in FIG. 1 according to an embodiment of the disclosure. In the embodiment shown in FIG. 2, current mirror 140 includes a transistor 141 and a transistor 142. The first terminal (e.g., the source) of the transistor 141 is coupled to the ground voltage GND. The second terminal (e.g., the drain) of the transistor 141 is coupled to the slave current terminal of the current mirror 140, that is, to the second terminal of the transistor 110. The first terminal (e.g., the source) of the transistor 142 is coupled to the ground voltage GND. A second terminal (e.g., a drain) of the transistor 142 is coupled to the master current terminal of the current mirror 140. A control terminal (e.g., a gate) of the transistor 142 is coupled to a second terminal of the transistor 142 and a control terminal (e.g., a gate) of the transistor 141. In the embodiment shown in FIG. 2, the transistor 141 and the transistor 142 are NMOS transistors.

In the embodiment shown in FIG. 2, the bias voltage generating circuit 130 includes a resistor Ra, a resistor Rb, a transistor 131, and a current source 132. The first terminal (e.g., the source) of the transistor 131 is coupled to the first input terminal CSP or the second input terminal CSN.

A second terminal (e.g., a drain) of the transistor 131 is coupled to a control terminal (e.g., a gate) of the transistor 131 and a current source 132. Therefore, the transistor 131, the transistor 110, and the transistor 120 can be regarded as a current mirror. The first terminal of the resistor Ra is coupled to the control terminal of the transistor 110 to provide a bias voltage Va. The second terminal of the resistor Ra is coupled to the control terminal of the transistor 131. The first terminal of the resistor Rb is coupled to the control terminal of the transistor 120 to provide a bias voltage Vb. The second terminal of the resistor Rb is coupled to the control terminal of the transistor 131. In the embodiment shown in FIG. 2, the resistances of the resistor Ra and the resistor Rb are set to be the same. In the case where the leakage current is not considered, that is, if the resistor Ra and the resistor Rb have no current, Va=Vb=Vs, where Vs represents the voltage of the control terminal of the transistor 131.

In the application scenario shown in FIG. 2, assuming that a current flows from the first input terminal CSP to the second input terminal CSN through the current sensing resistor RS, the voltage of the second input terminal CSN is the voltage of the first input terminal CSP minus the voltage drop of the current sensing resistor RS, that is, CSN=CSP−IS*RS. Assuming Vsg1 represents the source gate voltage of transistor 110 and Vsg2 represents the source gate voltage of transistor 120, then Vsg1=CSP−Va and Vsg2=CSN−Vb. Without considering the leakage current, the resistor Ra and the resistor Rb have no current, so Va=Vb=Vs. When the current IS flows from the first input terminal CSP to the second input terminal CSN, the voltage of the first input terminal CSP is greater than the voltage of the second input terminal CSN, and at this time, the source gate voltage Vsg1 of the transistor 110 may be greater than the source gate voltage Vsg2 of the transistor 120 such that the current Ia flowing through the transistor 110 is greater than the current Ib flowing through the transistor 120. At this time, the transistor 110 turns on to pull up the voltage of the output terminal OCP of the voltage comparator 100. When the current IS flows from the second input terminal CSN to the first input terminal CSP, the voltage of the first input terminal CSP is less than the voltage of the second input terminal CSN, and the source gate voltage Vsg2 of the transistor 120 is greater than the source gate voltage Vsg1 of the transistor 110 such that the current Ib flowing through the transistor 120 is greater than the current Ia flowing through the transistor 110. At this time, the transistor 120 is turned on to cause the current mirror 140 to pull down the voltage of the output terminal OCP of the voltage comparator 100.

In an embodiment, the current sensor shown in FIG. 1 and FIG. 2 can be applied to the field of USB PD 3.0 to detect whether current in the current path through the power source of 22V or higher is overcurrent, in this application, transistor 110, transistor 120 and transistor 131 are high voltage components that withstand high voltages of 22V and above. That is, a selection of the transistor 110, the transistor 120, and the transistor 131 subjected to the corresponding magnitude of the voltage would not be destroyed. In an embodiment, the current sensing resistor RS shown in FIG. 1 and FIG. 2 can be of the mΩ rating, such as 5 mΩ, 10 mΩ, or 20 mΩ.

Figure 3:
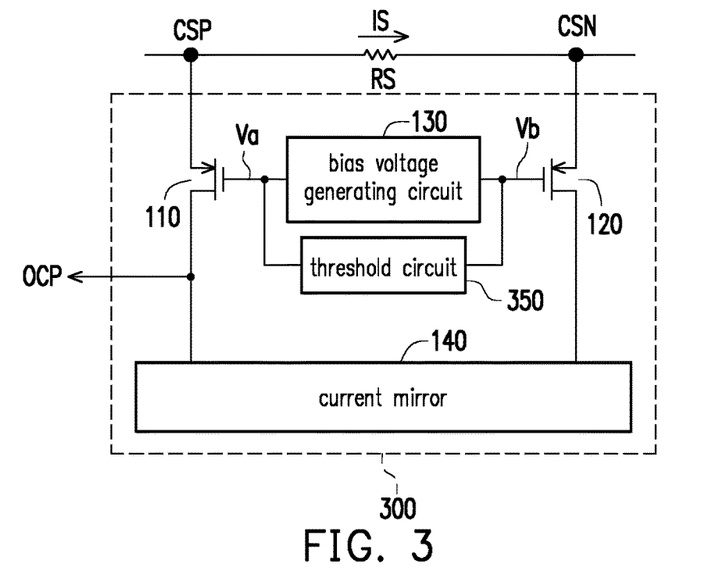
FIG. 3 is a schematic diagram of circuit blocks of a current sensor according to another embodiment of the disclosure.

FIG. 3 is a schematic diagram of circuit blocks of a current sensor according to another embodiment of the disclosure. The current sensor shown in FIG. 3 includes a voltage comparator 300 and a current sensing resistor RS. The voltage comparator 300 includes a transistor 110, a transistor 120, a bias voltage generating circuit 130, a current mirror 140, and a threshold circuit 350. For the transistor 110, the transistor 120, the bias voltage generating circuit 130 and the current mirror 140 shown in FIG. 3, reference may be made to the description of the transistor 110, the transistor 120, the bias voltage generating circuit 130 and the current mirror 140 shown in FIG. 1, and therefore, it will not be repeated. The first terminal of the threshold circuit 350 is coupled to the control terminal of the transistor 110. The second terminal of the threshold circuit 350 is coupled to the control terminal of the transistor 120. The threshold circuit 350 can determine the threshold voltage of voltage comparator 300. When the voltage difference between the voltage of the first input terminal CSP and the voltage of the second input terminal CSN is less than the threshold voltage of the voltage comparator 300, the voltage of the output terminal OCP is maintained at a low logic level. When the voltage difference between the voltage of the first input terminal CSP and the voltage of the second input terminal CSN is greater than the threshold voltage of the voltage comparator 300, the voltage of the output terminal OCP transitions from a low logic level to a high logic level.

Figure 4:
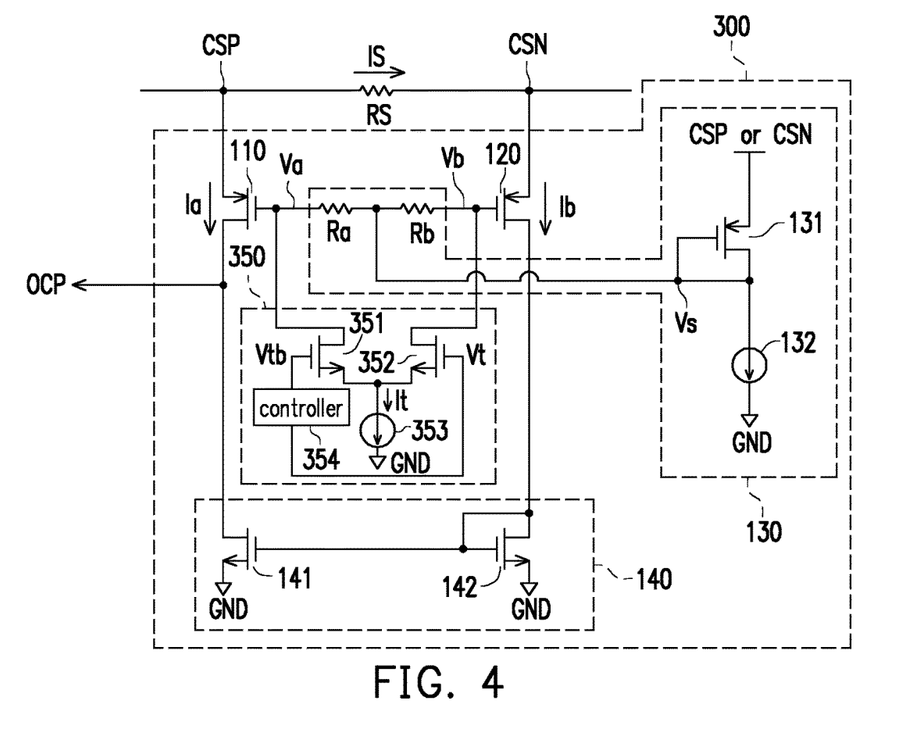
FIG. 4 is a circuit diagram of the bias voltage generating circuit, the current mirror, and the threshold circuit shown in FIG. 3 according to an embodiment of the disclosure.

FIG. 4 is a schematic circuit diagram of the bias voltage generating circuit 130, the current mirror 140, and the threshold circuit 350 shown in FIG. 3 according to an embodiment of the disclosure. For the transistor 110, the transistor 120, the bias voltage generating circuit 130 and the current mirror 140 shown in FIG. 4, reference may be made to the description of the transistor 110, the transistor 120, the bias voltage generating circuit 130 and the current mirror 140 shown in FIG. 2, and therefore, it will not be repeated. In the embodiment shown in FIG. 4, the threshold circuit 350 includes a switch 351, a switch 352, a current source 353, and a controller 354. The control terminal of the switch 351 is coupled to the control signal Vtb. The first terminal of the switch 351 is coupled to the current source 353. The second terminal of the switch 351 is coupled to the first terminal of the threshold circuit 350, that is, coupled to the control terminal of the transistor 110. The control terminal of the switch 352 is coupled to the control signal Vt. The first terminal of the switch 352 is coupled to the current source 353. The second terminal of the switch 352 is coupled to the second terminal of the threshold circuit 350, that is, coupled to the control terminal of the transistor 120. The controller 354 is coupled to the control terminal of the switch 351 to provide a control signal Vtb. The controller 354 is coupled to the control terminal of the switch 352 to provide a control signal Vt. Based on the control of the controller 354, the switch 351 and the switch 352 are not turned on at the same time.

The voltage of the second input terminal CSN is the voltage of the first input terminal CSP minus the voltage drop of the current sensing resistor RS, that is, CSN=CSP−IS*RS. Assuming Vsg1 represents the source gate voltage of transistor 110, and Vsg2 represents the source gate voltage of transistor 120, then Vsg1=CSP−Va and Vsg2=CSN−Vb. Without considering the leakage current, if the resistor Ra and the resistor Rb have no current, then Va=Vb=Vs. Here, the resistance of the resistor Ra is set to be the same as the resistance of the resistor Rb. The controller 354 can control the conduction state of the switch 351 and the switch 352 to allow the current source 353 to selectively draw current from the resistor Ra or the resistor Rb. In addition, the controller 354 can control the amount of current of the current source 353 to determine the threshold voltage of the voltage comparator 300.

For convenience of explanation, it is assumed here that when the current flows from the first input terminal CSP to the second input terminal CSN through the current sensing resistor RS, the voltage of the first input terminal CSP is greater than the voltage of the second input terminal CSN, so the controller 354 turns on the switch 352 and turns off the switch 351. When the switch 352 is turned on, the current source 353 draws the current It from the resistor Rb through the switch 352 such that the bias voltage Vb falls to Vs−It*Rb. Therefore, when the voltage of the first input terminal CSP is equal to the voltage of the second input terminal CSN (that is, the current IS flowing through the current sensing resistor RS is 0), the source gate voltage Vsg1 of the transistor 110 is less than the source gate voltage Vsg2 of the transistor 120. That is, the voltage at the output terminal OCP is maintained at a low logic level. In an embodiment, as the current IS increases, the voltage of the second input terminal CSN gradually decreases compared to the voltage of the first input terminal CSP. That is, as the current IS increases, the source gate voltage Vsg2 of the transistor 120 gradually decreases as compared with the source gate voltage Vsg1 of the transistor 110. When the source gate voltage Vsg1 of the transistor 110 is no longer less than the source gate voltage Vsg2 of the transistor 120, the voltage difference between the voltage of the first input terminal CSP and the voltage of the second input terminal CSN has reached the threshold voltage of the voltage comparator 300. When the source gate voltage Vsg1 is greater than the source gate voltage Vsg2, CSP−Va>CSN−Vb, i.e. CSP−Vs>(CSP−IS*RS)−(Vs−It*Rb). It can be seen that when the voltage difference between the first input terminal CSP and the second input terminal CSN has reached the threshold voltage of the voltage comparator 300, IS*RS>It*Rb, and at this time, the voltage of the output terminal OCP will transition from a low logic level to a high logic level. Since the current IS and the current sensing resistor RS are both predetermined values, the circuit designer can determine the threshold voltage of the voltage comparator 300 by selecting the size of It and Rb (or Ra).

It should be noted that the foregoing description is based on assumption that the voltage of the first input terminal CSP is greater than the voltage of the second input terminal CSN when the current flows from the first input terminal CSP to the second input terminal CSN through the current sensing resistor. In other embodiments, when the current flows from the second input terminal CSN to the first input terminal CSP through the current sensing resistor RS, the voltage of the second input terminal CSN is greater than the voltage of the first input terminal CSP, and the controller 354 turns on the switch 351 and turns off the switch 352. When the switch 351 turns on, the current source 353 draws the current It from the resistor Ra through the switch 351 such that the bias voltage Va is lowered to Vs−It*Ra. Therefore, when the voltage difference between the first input terminal CSP and the second input terminal CSN has reached the threshold voltage of the voltage comparator 300, IS*RS>It*Ra, the voltage of the output terminal OCP will transition from a high logic level to a low logic level (the voltage signal of the output terminal OCP is negative logic at this time). Since both the current IS and the current sensing resistor RS are both predetermined values, the circuit designer can determine the threshold voltage of the voltage comparator 300 by selecting the size of It and Ra (or Rb).

In an embodiment, when the current sensor shown in FIG. 3 and FIG. 4 is applied in the field of USB PD 3.0, it is used to detect the current in the current path of the power source of 22V or higher is overcurrent. The transistor 110, the transistor 120, the transistor 131, the transistor 351, and the transistor 352 are high voltage components to withstand high voltages of 22V and above. That is to say, the selection of the transistor 110, the transistor 120, the transistor 131, the transistor 351, and the transistor 352 subjected to the corresponding to the magnitude of the voltage would not to be destroyed.

Figure 5:
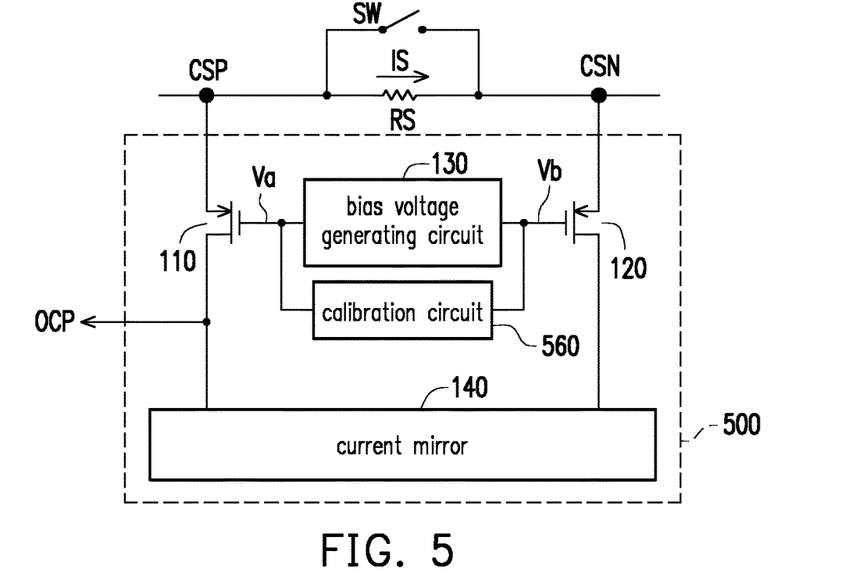
FIG. 5 is a schematic diagram of circuit blocks of a current sensor according to another embodiment of the disclosure.

FIG. 5 is a schematic diagram of circuit blocks of a voltage comparator 500 according to another embodiment of the disclosure. The current sensor shown in FIG. 3 includes a voltage comparator 500 and a current sensing resistor RS. The voltage comparator 500 includes a transistor 110, a transistor 120, a bias voltage generating circuit 130, a current mirror 140, and a calibration circuit 560. For the transistor 110, the transistor 120, the bias voltage generating circuit 130 and the current mirror 140 shown in FIG. 5, reference may be made to the description of the transistor 110, the transistor 120, the bias voltage generating circuit 130 and the current mirror 140 shown in FIG. 1, and therefore, it will not be repeated. The first terminal of the calibration circuit 560 is coupled to the control terminal of the transistor 110. The second terminal of the calibration circuit 560 is coupled to the control terminal of the transistor 120. The calibration circuit 560 can correct/compensate for transistor errors due to process drift (process variation).

During an initialization period, the first input terminal CSP is directly connected to the second input terminal CSN such that the voltage of the first input terminal CSP is equal to the voltage of the second input terminal CSN. In an embodiment, the first input terminal CSP and the second input terminal CSN can be connected by turning on a switch SW. During the initialization period, the calibration circuit 560 can selectively adjust the bias voltage Va and/or the bias voltage Vb while checking whether the output terminal OCP of the voltage comparator 500 has a transition event. When the transition event occurs at the output terminal OCP, the calibration circuit 560 can record the calibration parameter associated with the bias voltage Va and/or the bias voltage Vb. During a normal operation period, the switch SW does not turn on, and the calibration circuit 560 can adjust the bias voltage Va and/or the bias voltage Vb according to the calibration parameter to correct/compensate the transistor error due to process drift (process variation).

Figure 6:
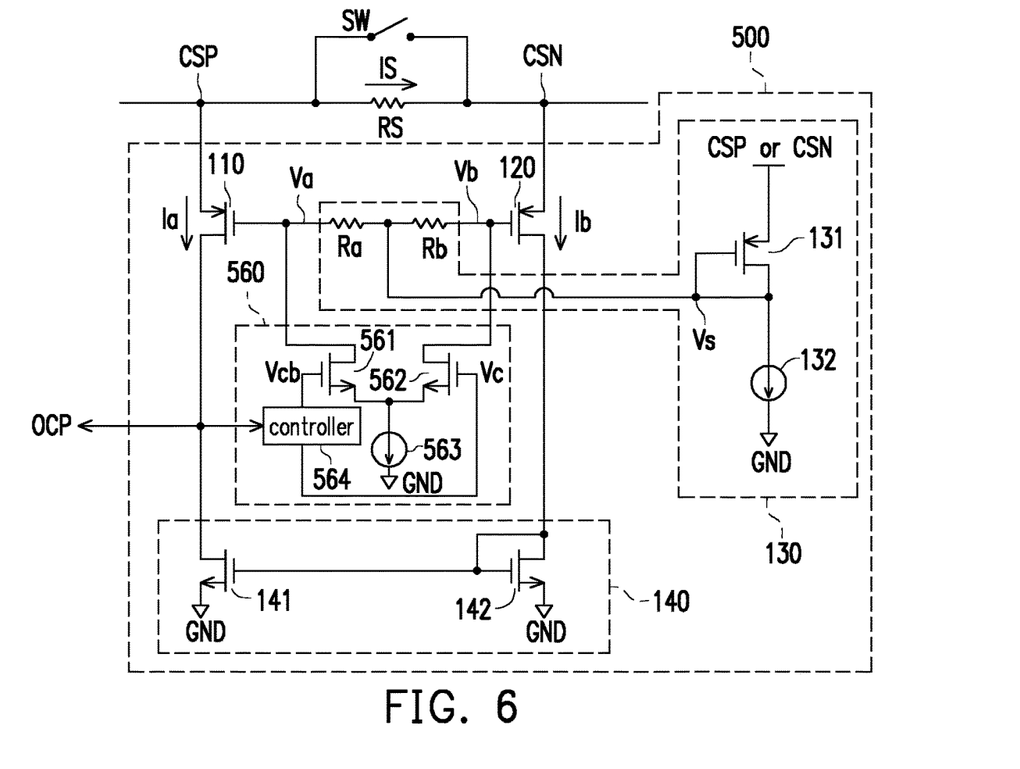
FIG. 6 is a circuit diagram of the bias voltage generating circuit, the current mirror, and the calibration circuit shown in FIG. 5 according to an embodiment of the disclosure.

FIG. 6 is a schematic circuit diagram of the bias voltage generating circuit 130, the current mirror 140, and the calibration circuit 560 shown in FIG. 5 according to an embodiment of the disclosure. For the transistor 110, the transistor 120, the bias voltage generating circuit 130 and the current mirror 140 shown in FIG. 6, reference may be made to the description of the transistor 110, the transistor 120, the bias voltage generating circuit 130 and the current mirror 140 shown in FIG. 2, and therefore, it will not be repeated. In the embodiment shown in FIG. 6, the calibration circuit 560 includes a switch 561, a switch 562, a current source 563, and a controller 564. The control terminal of the switch 561 is coupled to the control signal Vcb. The first terminal of the switch 561 is coupled to the current source 563. The second terminal of the switch 561 is coupled to the first terminal of the calibration circuit 560, that is, coupled to the control terminal of the transistor 110. The control terminal of the switch 562 is coupled to the control signal Vc. The first terminal of the switch 562 is coupled to the current source 563. The second terminal of the switch 562 is coupled to the second terminal of the calibration circuit 560, that is, coupled to the control terminal of the transistor 120.

The controller 564 is coupled to the control terminal of the switch 561 to provide a control signal Vcb. The controller 564 is coupled to the control terminal of the switch 562 to provide a control signal Vc. Based on the control of the controller 564, the switch 561 and the switch 562 are not turned on at the same time. The controller 564 is coupled to the current source 563 to set the current of the current source 563. The controller 564 is coupled to the output terminal OCP of the voltage comparator 500 to check for the transition event.

In detail, during the initialization period, the first input terminal CSP is directly connected to the second input terminal CSN such that the voltage of the first input terminal CSP is equal to the voltage of the second input terminal CSN. In an embodiment, the first input terminal CSP and the second input terminal CSN may be connected by turning on a switch SW. Without considering the leakage current, if the resistor Ra and the resistor Rb have no current, then Va=Vb=Vs. During the initialization period, the controller 564 selectively turns on the switch 561 or switch 562 and selectively sets the current of the current source 563 to facilitate checking whether the transition event occurs at the output terminal OCP of the voltage comparator 500. For example, controller 564 turns on switch 561 and turns off switch 562 so that the current source 563 can draw current from resistor Ra. During the period when switch 561 is turned on, controller 564 controls current source 563 to change the current of current source 563 until a transition event occurs at output terminal OCP. During the period when the switch 561 is turned on, if no transition event occurs at the output terminal OCP within the adjustment range of the current of the current source 563, the controller 564 can turn off the switch 561 and turn on the switch 562, so that the current source 563 can draw current from the resistor Rb. During the period when switch 562 is turned on, controller 564 controls current source 563 to change the current of current source 563 until a transition event occurs at output terminal OCP.

After the transition event occurs at the output terminal OCP of the voltage comparator 500, the initialization period may end, and the switch SW does not turn on, so that the direct connection between the first input terminal CSP and the second input terminal CSN may be released. When a transition event occurs at the output terminal OCP, the controller 564 can record the on state of the current switch 561, the on state of the switch 562, and the current setting state of the current source 563 to the calibration parameter. During the normal operation period, the switch SW does not turn on, and the controller 564 can control the conduction state of the switch 561, the conduction state of the switch 562, and the current setting state of the current source 563 according to the calibration parameter.

For example, during the initialization period, assuming that "the switch 562 is turned on" and "the current of the current source 563 is Ic", a transition event occurs at the output terminal OCP. The transition event refers to the transition of the output terminal OCP voltage from a low logic level to a high logic level or from a high logic level to a logic level. At this time, since the current source 563 draws the current Ic from the resistor Rb through the switch 562, the bias voltage Vb is lowered to Vs−Ic*Rb. The controller 564 can record "the switch 561 is turned off", "the switch 562 is turned on", and "the current of the current source 563 is Ic" to the calibration parameter. During the normal operation period, according to the calibration parameter, controller 564 can maintain the cutoff of switch 561, maintain the turn on of switch 562, and maintain current of current source 563 at Ic.

In an embodiment, when the current sensor shown in FIG. 5 and FIG. 6 is applied in the field of USB PD 3.0, it is used to detect the current in the current path flowing through the power source of the 22V or higher is overcurrent. The transistor 110, the transistor 120, the transistor 131, the transistor 561, and the transistor 562 are high voltage components to withstand high voltages above 22V. That is to say, the selection of the transistor 110, the transistor 120, and the transistor 131, the transistor 561, and the transistor 562 subjected to a corresponding the magnitude of the voltage would not to be destroyed.

Figure 7:
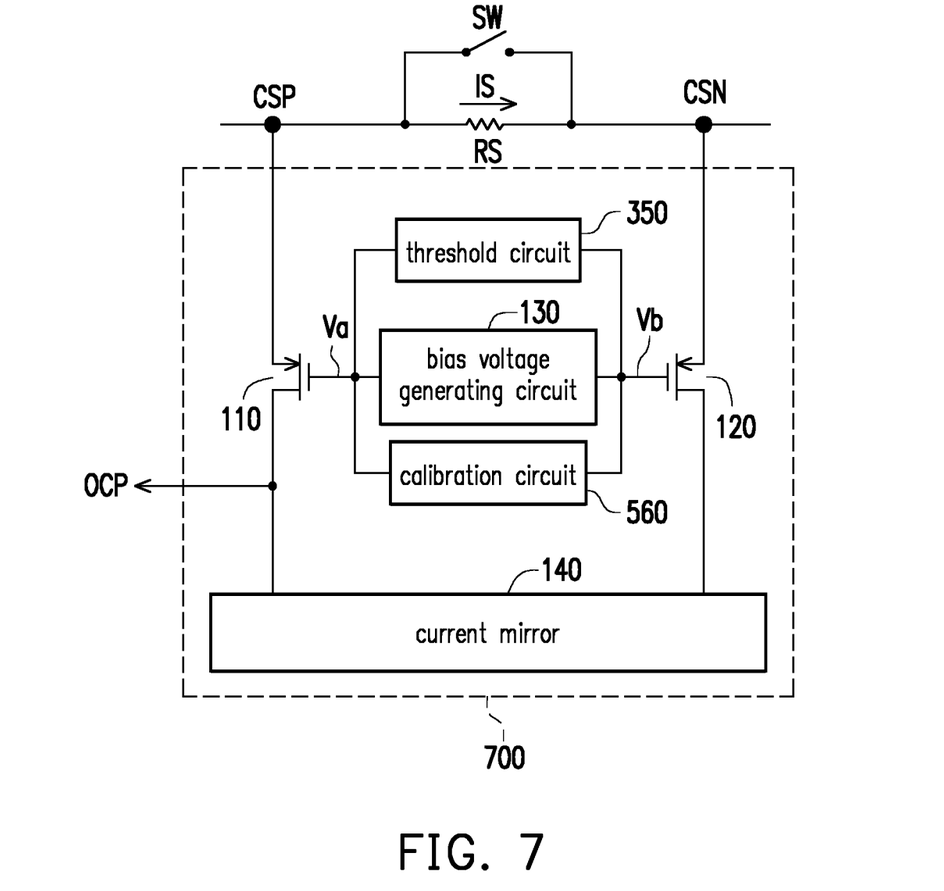
FIG. 7 is a schematic diagram of circuit blocks of a current sensor according to another embodiment of the disclosure.

FIG. 7 is a schematic diagram of circuit blocks of a voltage comparator 700 according to still another embodiment of the disclosure. The current sensor shown in FIG. 7 includes a voltage comparator 700 and a current sensing resistor RS. The voltage comparator 700 includes a transistor 110, a transistor 120, a bias voltage generating circuit 130, a current mirror 140, a threshold circuit 350, and a calibration circuit 560. For the transistor 110, the transistor 120, the bias voltage generating circuit 130 and the current mirror 140 shown in FIG. 7, reference may be made to the descriptions of the transistor 110, the transistor 120, the bias voltage generating circuit 130 and the current mirror 140 shown in FIG. 1 to FIG. 6; for the threshold circuit 350 shown in FIG. 7, reference may be made to the description of the threshold circuit 350 shown in FIG. 3 and FIG. 4; for the calibration circuit 560 shown in FIG. 7, reference may be made to the description of the calibration circuit 560 shown in FIG. 5 to FIG. 6, and therefore, it will not be repeated. During the initialization period, the voltage comparator 700 of FIG. 7 first connects the first input terminal CSP and the second input terminal CSN by turning on a switch SW. At this time, only the calibration circuit 560 operates for causing that the conduction state of the switch in the current calibration circuit 560 and the current setting state of the current source are recorded to the calibration parameter when a transition event occurs on the output terminal OCP. When the initialization period ends, the switch SW is turn off, so that the direct connection between the first input terminal CSP and the second input terminal CSN can be removed, at which time the threshold circuit 350 operates at a normal operation period, and the calibration circuit 560 controls the conduction state of the switch in the calibration circuit 560 and the current setting state of the current source according to the previously recorded calibration parameter.

In summary, the current sensor of the embodiments of the disclosure includes a voltage comparator and a current sensing resistor. The first terminal and the second terminal of the current sensing resistor are respectively coupled to the first input terminal and the second input terminal of the current sensor. The voltage at the input of the current sensor is sent to the non-control terminal (non-gate) of the input stage transistor. The two bias voltages generated by the bias generating circuit of the current sensor are dependent on one of the voltages of the two input terminals of the current sensor, so that the source gate voltage of the two input stage transistors of the current sensor is controlled to a small swing. The advantage is that the current sensor can be used to detect a large voltage range, for example, in the field of USB PD 3.0, to detect whether the current path of the power source flowing through the 22V or higher power source is overcurrent, but not limited to this. When the current IS flows from the first input terminal CSP to the second input terminal CSN, the voltage of the first input terminal CSP of the current sensing is greater than the voltage of the second input terminal CSN of the current sensor, and at this time, the source gate voltage of the transistor 110 is greater than the source gate voltage of the transistor 120 such that the current flowing through the transistor 110 is greater than the current flowing through the transistor 120. At this time, the transistor 110 turns on to pull up the voltage of the output terminal OCP of the current sensor. When the current IS flows from the second input terminal CSN to the first input terminal CSP, the voltage of the first input terminal CSP of the current sensing is lower than the voltage of the second input terminal CSN of the current sensor, and the source gate voltage of the transistor 120 is greater than the source gate voltage of the transistor 110 such that the current flowing through the transistor 120 is greater than the current flowing through the transistor 110. At this time, the transistor 120 will turn on, thereby causing the current mirror 140 to pull down the voltage of the output terminal OCP of the current sensor. Therefore, the current sensor can perform current sensing.

The disclosure has been disclosed in the above embodiments, but it is not intended to limit the disclosure, and those skilled in the art can make a few changes without departing from the spirit and scope of the disclosure. The scope of protection of the disclosure is defined by the scope of the appended claims.

What is claimed is:

1. A current sensor, comprising:
   a current sensing resistor having a first terminal and a second terminal respectively coupled to a first input terminal and a second input terminal of the current sensor;
   a first transistor having a first terminal, a second terminal, and a control terminal, wherein the first terminal of the first transistor is coupled to the first input terminal of the current sensor, and the second terminal of the first transistor is coupled to an output terminal of the current sensor;
   a second transistor having a first terminal, a second terminal and a control terminal, wherein the first terminal of the second transistor is coupled to the second input terminal of the current sensor;
   a bias voltage generating circuit, coupled to the control terminal of the first transistor to provide a first bias voltage, and coupled to the control terminal of the second transistor to provide a second bias voltage, wherein the first bias voltage and the second bias voltage depend on a voltage of the first input terminal of the current sensor or a voltage of the second input terminal of the current sensor, wherein the bias voltage generating circuit comprises a third transistor, a current source, a first resistor and a second resistor, a first terminal of the third transistor is coupled to the first input terminal of the current sensor or the second input terminal of the current sensor, a second terminal of the third transistor is coupled to a control terminal of the third transistor, the current source is coupled to the second terminal of the third transistor, a first terminal of the first resistor is coupled to the control terminal of the first transistor to provide the first bias voltage, a second terminal of the first resistor is coupled to the control terminal of the third transistor, a first terminal of the second resistor is coupled to the control terminal of the second transistor to provide the second bias voltage, and a second terminal of the second resistor is coupled to the control terminal of the third transistor; and
   a current mirror having a first current terminal and a second current terminal, wherein the first current terminal of the current mirror is coupled to the second terminal of the second transistor, and the second current terminal of the current mirror is coupled to the second terminal of the first transistor.

2. The current sensor according to claim 1, the first bias voltage and the second bias voltage are dependent on one of the voltage of the first input terminal and the voltage of the second input terminal.

3. The current sensor according to claim 2, wherein the first bias voltage is a difference between the voltage of the first input terminal and a threshold voltage of the first transistor, or the second bias voltage is a difference between the voltage of the second input terminal and a threshold voltage of the second transistor.

4. The current sensor according to claim 1, wherein the first current terminal of the current mirror is a master current terminal, and the second current terminal of the current mirror is a slave current terminal.

5. The current sensor according to claim 4, wherein the current mirror comprises:
   a fourth transistor having a first terminal, a second terminal and a control terminal, wherein the first terminal of the fourth transistor is coupled to a ground voltage, and the second terminal of the fourth transistor is coupled to the slave current terminal;
   a fifth transistor having a first terminal, a second terminal and a control terminal, wherein the first terminal of the fifth transistor is coupled to the ground voltage, the second terminal of the fifth transistor is coupled to the master current terminal, and the control terminal of the fifth transistor is coupled to the second terminal of the fifth transistor and the control terminal of the fourth transistor.

6. The current sensor according to claim 1, further comprising:
   a threshold circuit having a first terminal and a second terminal, wherein the first terminal of the threshold circuit is coupled to the control terminal of the first transistor, and the second terminal of the threshold circuit is coupled to the control terminal of the second transistor.

7. The current sensor according to claim 6, wherein the threshold circuit comprises:
   a current source;
   a first switch having a first terminal, a second terminal and a control terminal, wherein the control terminal of the first switch is coupled to a first control signal, the first terminal of the first switch is coupled to the current source, and the second terminal of the first switch is coupled to the first terminal of the threshold circuit;
   a second switch having a first terminal, a second terminal and a control terminal, wherein the control terminal of the second switch is coupled to a second control signal, the first terminal of the second switch is coupled to the current source, and the second terminal of the second switch is coupled to the second terminal of the threshold circuit; and a controller coupled to the control terminal of the first switch to provide the first control signal and coupled to the control terminal of the second switch to provide the second control signal.

8. The current sensor according to claim 7, wherein the first switch and the second switch are not turned on at the same time.

9. The current sensor according to claim 1, further comprising:
- a calibration circuit having a first terminal and a second terminal, wherein the first terminal of the calibration circuit is coupled to the control terminal of the first transistor, and the second terminal of the calibration circuit is coupled to the control terminal of the second transistor.

10. The current sensor according to claim 9, wherein the calibration circuit comprises:
- a current source;
- a first switch having a first terminal, a second terminal and a control terminal, wherein the control terminal of the first switch is coupled to a first control signal, the first terminal of the first switch is coupled to the current source, and the second terminal of the first switch is coupled to the first terminal of the calibration circuit;
- a second switch having a first terminal, a second terminal and a control terminal, wherein the control terminal of the second switch is coupled to a second control signal, the first terminal of the second switch is coupled to the current source, and the second terminal of the second switch is coupled to the second terminal of the calibration circuit; and
- a controller, coupled to the current source to set a current of the current source, coupled to the control terminal of the first switch to provide the first control signal, coupled to the control terminal of the second switch to provide the second control signal, and coupled to the output terminal of the current sensor to check for a transition event.

11. The current sensor according to claim 10, wherein
- during an initialization period, the controller selectively turns on the first switch or the second switch, and selectively sets the current of the current source, so as to check whether the transition event occurs at the output terminal of the current sensor;
- when the transition event occurs at the output terminal of the current sensor, the controller records a conduction state of the first switch, a conduction state of the second switch, and a current setting state of the current source to a calibration parameter; and
- during a normal operation period, the controller controls the conduction state of the first switch, the conduction state of the second switch, and the current setting state of the current source according to the calibration parameter.

12. The current sensor according to claim 10, wherein the first input terminal of the current sensor is directly connected to the second input terminal of the current sensor during a initialization period, such that the voltage of the first input terminal is equal to the voltage of the second input terminal.

* * * * *